United States Patent [19]

North et al.

[11] 4,196,359
[45] Apr. 1, 1980

[54] DIFFERENTIALLY-CHARGED AND SEQUENTIALLY-SWITCHED SQUARE-WAVE PULSE FORMING NETWORK

[75] Inventors: George G. North, Stockton; George E. Vogilin, Livermore, both of Calif.

[73] Assignee: The United States of America as represented by the United States Department of Energy, Washington, D.C.

[21] Appl. No.: 913,634

[22] Filed: Jun. 8, 1978

[51] Int. Cl.$^2$ ........................... H03K 5/01; H03K 4/00
[52] U.S. Cl. ................................. 307/268; 307/252 L; 328/67
[58] Field of Search ........... 307/252 K, 252 L, 252 Q, 307/318, 264, 268; 328/66, 67, 65

[56] References Cited

U.S. PATENT DOCUMENTS

| | | | |
|---|---|---|---|
| 2,294,863 | 9/1942 | Hadfield | 328/177 |
| 2,764,678 | 9/1956 | Craib | 328/58 |
| 3,051,906 | 8/1962 | Haynes | 328/14 |
| 3,578,986 | 5/1971 | McGuffin et al. | 307/246 |
| 3,590,279 | 6/1971 | Thompson et al. | 328/67 X |
| 3,645,491 | 4/1972 | Earp | 307/262 |

FOREIGN PATENT DOCUMENTS

| | | | |
|---|---|---|---|
| 1130644 | 10/1968 | United Kingdom | 328/67 |
| 155826 | 3/1964 | U.S.S.R. | 328/58 |
| 240009 | 8/1969 | U.S.S.R. | 328/65 |

OTHER PUBLICATIONS

G. G. North, Design and Test of a Series Switch-/Regulator System for a 40-KV, 80-A, 10-ms, Neutral Beam Power Supply, Preprint UCRL-79673, Lawrence Livermore Laboratory, Livermore, Calif., Oct. 18, 1977.

Primary Examiner—John Zazworsky
Attorney, Agent, or Firm—R. V. Lupo; Roger S. Gaither; Clifton E. Clouse

[57] ABSTRACT

A pulse forming network for delivering a high-energy square-wave pulse to a load, including a series of inductive-capacitive sections wherein the capacitors are differentially charged higher further from the load. Each charged capacitor is isolated from adjacent sections and the load by means of a normally open switch at the output of each section. The switch between the load and the closest section to the load is closed to begin discharge of the capacitor in that section into the load. During discharge of each capacitor, the voltage thereacross falls to a predetermined potential with respect to the potential across the capacitor in the next adjacent section further from the load. When this potential is reached, it is used to close the switch in the adjacent section further from the load and thereby apply the charge in that section to the load through the adjacent section toward the load. Each successive section further from the load is sequentially switched in this manner to continuously and evenly supply energy to the load over the period of the pulse, with the differentially charged capacitors providing higher potentials away from the load to compensate for the voltage drop across the resistance of each inductor. This arrangement is low in cost and yet provides a high-energy pulse in an acceptable square-wave form.

9 Claims, 5 Drawing Figures

DIFFERENTIALLY-CHARGED AND SEQUENTIALLY-SWITCHED SQUARE-WAVE PULSE FORMING NETWORK

BACKGROUND OF THE INVENTION

The invention disclosed herein was made at the Lawrence Livermore Laboratory under, on in, the course of U.S. Department of Energy Contract No. W-7405-ENG-48 with the University of California.

The present invention relates to a high-energy pulse forming network, and more particularly, it relates to a network that is comprised of a series of inductive-capacitive sections that are differentially charged higher further from the load and sequentially switched into the load.

In operation of a high-energy neutral beam source at the Lawrence Livermore Laboratory, high-energy square-wave pulses are required to drive the accelerator electrodes of the source. These pulses are on the order of 40 KV, 80 A, 10 msec, and should have a highly square waveshape. If a conventional passive high-energy inductive-capacitive pulse forming network were to be used, very low resistance inductors would be required to deliver a pulse having an adequately square waveshape for the neutral beam source. However, low resistance inductors are so expensive as to make their use impractical from a cost standpoint. Other passive pulse forming networks known in the art that could be used to deliver an acceptable square-wave pulse would require inductors and capacitors of precisely different values. Therefore, these also would be unacceptable from a cost standpoint. Currently, a series-switch regulator system in conjunction with a charged capacitor bank is used for the source. The system is described in a report by G. Gordon North, *Design and Test of a Series Switch/Regulator System for a 40-KV, 80-A, 10 msec, Neutral Beam Power Supply*, Preprint UCRL-79673, Lawrence Livermore Laboratory, Livermore, California. However, the series-switch regulator system described in the report includes an enormous capacitor bank wherein three times the energy to be used is stored in the capacitor bank. Such an arrangement therefore includes a very large and consequently a very expensive capacitor bank with a complex regulator. Alternatively, in an inductive-capacitive pulse forming network, virtually all of the energy stored in the network except for network resistive losses is delivered to the load. The capacitors of such a network may therefore be much smaller and less expensive for comparable pulses, thereby making the network a desirable choice, provided a circuit arrangement is used in which low-cost resistive inductors may be included without degrading the squareness of the pulse.

SUMMARY OF THE INVENTION

In brief, the invention relates to a pulse forming network for generating a high-energy square-wave pulse for delivery to a load and includes a series of sections each comprising an inductor and a capacitor, means for charging the capacitors to differential voltages that are higher further from the load, and means for sequentially switching the stored charge in each section to the load through adjacent sections to thereby deliver a high-energy square-wave pulse to the load.

An object of the invention is to provide an improved pulse forming network.

Another object is to arrange a pulse forming network, utilizing low-cost and consequently resistive inductors, for delivering a highly square-wave pulse to a load.

Another object is to construct a square-wave pulse forming network that is simple, reliable, compact, requires minimal maintenance, is stable over a wide range of temperatures, and is resistant to substantial vibration, for use with a pulsed particle source, such as for driving the accelerator electrodes of a neutral beam source.

Another object is to minimize the amount of energy stored in a square-wave pulse forming network to thereby reduce the capacity of the network to deliver a quantity of energy that is destructive to the load or the network under a fault condition.

Another object is to construct a square-wave pulse forming network having a series of sections of equal inductance and capacitance.

Another object is to construct a square-wave pulse forming network that appears resistive in the presence of a load fault.

Another object is to provide an inductive-capacitive square-wave pulse forming network in which virtually the entire quantity of energy stored in the network during an interpulse period is delivered to the load during the pulse period.

Other objects and advantageous features of the invention will be apparent in a description of a specific embodiment thereof, given by way of example only, to enable one skilled in the art to readily practice the invention which is described hereinafter with reference to the accompanying drawings.

DESCRIPTION OF PREFERRED EMBODIMENTS

Figure 1:
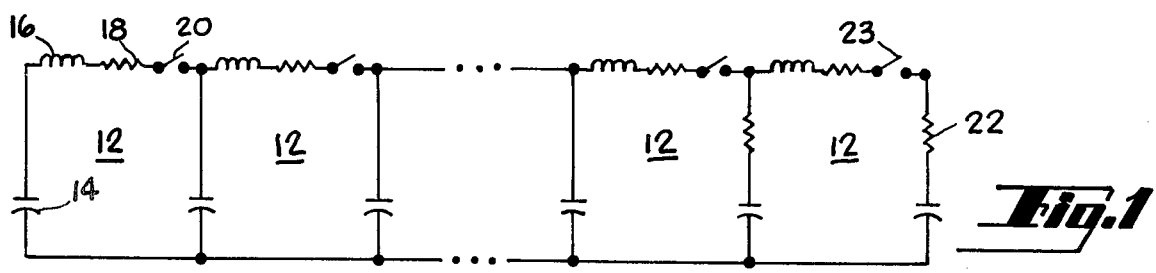
FIG. 1 is a generalized pulse forming network in reference to which the principles of the invention may be explained.
Figure 2:
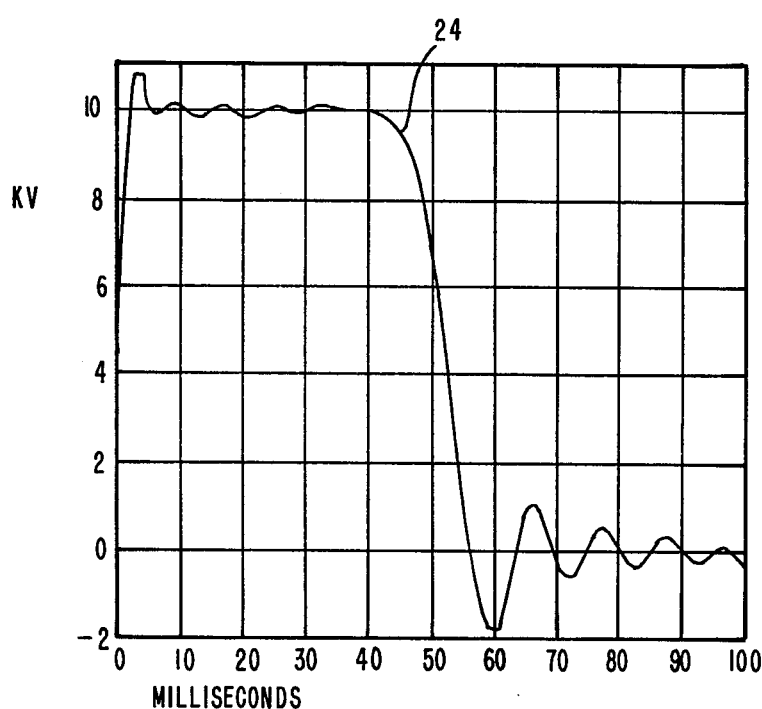
FIG. 2 is a curve of a square-wave pulse generated in the network of FIG. 1 when the inductors utilized in the network have zero resistance and the network is operated in a conventional manner.

Referring to the drawing, there is shown in FIG. 1 a generalized pulse forming network 10 including a series of sections 12, each including a capacitor 14, an inductor 16 having a resistance 18, and a switch 20. A load 22 is connected across the output of the network. In operation of the network 10 in essentially a conventional mode, the capacitors 14 are charged to equal voltage levels. (For operation in the conventional mode, the switches 20 are normally closed or the switches are eliminated and there is a direct connection between the sections 12.) A switch 23 is closed to initiate application of a pulse across the load 22. For the ideal case where the resistance 18 of each of the inductors is zero, a square-wave pulse is generated in a ten-section network with all of the capacitors charged to 20 KV to have the form of a curve 24 (FIG. 2). The curve 24 is considered to be representative of the best pulse obtainable with the network 10. However, inductors having resistances near zero or even of very low values are prohibitively expensive; and for inductors of practical resistance, the pulse is badly degraded and unacceptable when the network is operated in the conventional mode. By use of the invention, the curve 24 may be approximated closely by using low-cost resistive inductors wherein each of the capacitors 14 is charged to a higher differential level further from the load 22. Switches 20 are then closed sequentially, starting with the one adjacent the load 22, to provide a high-energy square-wave pulse having the form of a curve 26. The higher differential voltages are used to compensate for the resistive voltage drop in the inductors towards the load, while sequential closing of the switches 20 provides a relatively continuous and even supply of energy to the load at a peak voltage over the period of the pulse to thereby provide a highly square pulse to the load. It will be observed that the shape of the curve 26 is very nearly the same as the shape of the curve 24 for the ideal pulse forming network.

Figure 4:
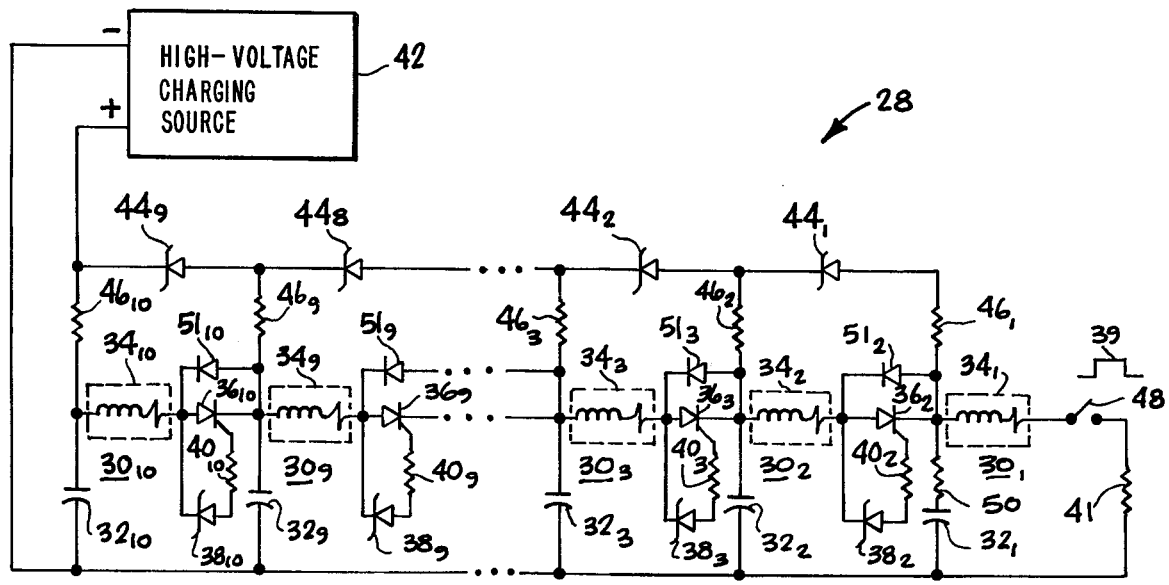
FIG. 4 is a diagram of a practical pulse forming network for generating the square-wave pulse of FIG. 3, including solid state components to enable differential charging and sequential switching of the network, according to the invention.
Figure 5:
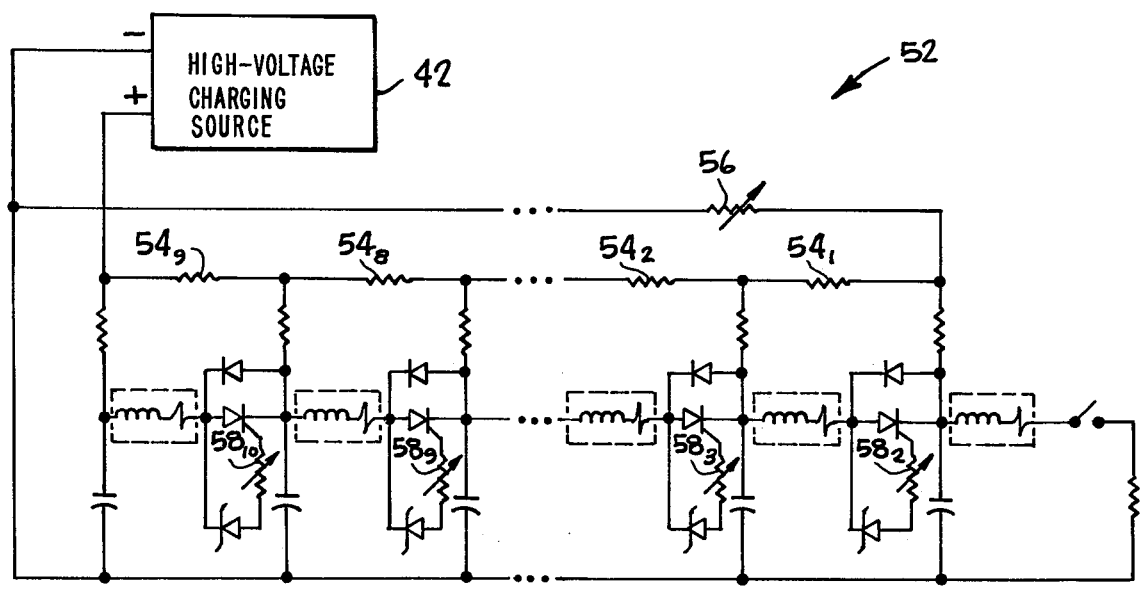
FIG. 5 is a diagram of a practical square-wave pulse forming network similar to that of FIG. 4, including means for adjusting the differential charging and switching levels of the network.

A practical pulse forming network 28 is shown in FIG. 4 for achieving the square-wave pulse represented by curve 26. The network 28 is comprised of sections $30_{1-10}$, each including respective capacitors $32_{1-10}$ and respective inductors $34_{1-10}$, each having an internal resistance. The capacitors $32_{1-10}$ are of equal capacitance and the inductors $34_{1-10}$ are of equal inductance. Each section $30_{2-10}$ also includes a silicon controlled rectifier (SCR) switch $36_{2-10}$, respectively, with a zener diode $38_{2-10}$ connected across the anode and control electrodes of the switch in series with a limiting resistor $40_{2-10}$ respectively.

In operation of the network 28 to supply a high-energy square-wave pulse 39 across a load 41, a high-voltage source 42 is applied across the capacitors $32_{1-10}$ through a string of zener diodes $44_{1-9}$ and limiting resistors $46_{1-10}$. The capacitors $32_{1-10}$ are thereby differentially charged to the full voltage of the source 42 less the voltage drop across the zener diodes $44_{1-9}$ between the source and each capacitor. To initiate the pulse 39, a switch 48 is closed to apply the voltage that is across the capacitor $32_1$ across the load 41 through the inductor $34_1$. Upon discharge of the capacitor $32_1$ to a predetermined voltage level, current through the zener diode $38_2$ and resistor $40_1$ increases to a threshold level at which the SCR $36_2$ breaks down so that the voltage across the capacitor $32_2$ is applied across the load 41 through the inductors $34_2$ and $34_1$. Thereafter, sequential switching of the capacitors $32_{3-10}$ across the load occurs in a like manner. Since the capacitor $32_2$, for example, was originally charged to a higher voltage level than the capacitor $32_1$, the peak of the pulse 39 is maintained even though the inductor $34_2$ may have substantial resistance. The switch $36_2$ provides isolation of the capacitor $32_2$ so that the capacitor may be charged to a differential level with respect to the capacitor $32_1$, and further provides a predetermined time delay for application of the voltage of capacitor $32_2$ across the load 41. This time delay prevents an abnormally high leading edge from building up in the pulse 39. Otherwise, if all capacitors $32_{1-10}$ were applied across the load simultaneously there would be a large forward wave towards the load. The delay also permits each capacitor to be individually switched into the network at predetermined spaced intervals to thereby maintain the peak of the pulse 39 at a constant level and to minimize sagging at the trailing edge of the pulse. In short the arrangement of the invention enables a controlled discharge from the load end of the network 28 to generate a high-energy square-wave pulse.

Figure 3:
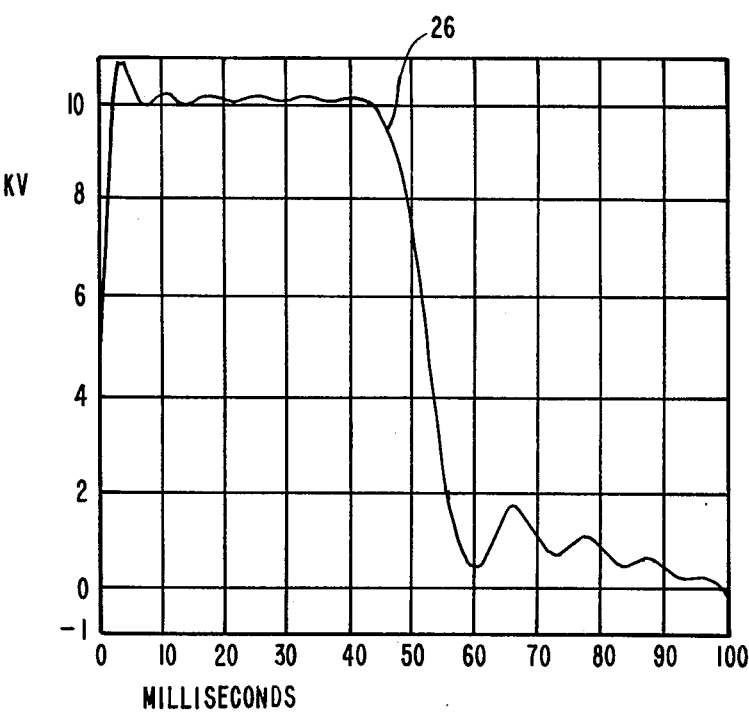
FIG. 3 is a curve of a square-wave pulse generated in the network of FIG. 1 when the inductors utilized in the network have a resistance representative of low-cost inductors and the network is constructed and operated according to the invention.

In an exemplary embodiment of the network 28, the inductors $34_{1-10}$ may be 0.3125 henrys each, with each having a resistance of 5 ohms. The capacitors $32_{1-10}$ may each have a capacitance of 20 microfarads. The load resistor 41 may be 125 ohms. A resistor 50 of 12.5 ohms may be inserted in series with capacitor 32, to minimize overshoot when the switch 48 is closed. The source 42 may be a 24000 volt source. The diodes $44_{1-9}$ may be selected so that there is a 400 volt drop across each during charging of the capacitors. The capacitor $32_1$ thus is charged to 20400 volts, and each adjacent capacitor away from the load is charged 400 volts higher, with the capacitor $32_{10}$ being charged to 24000 volts. The switches $36_{2-10}$ and associated diodes $38_{2-10}$ and resistors $40_{2-10}$ may be selected to switch the associated capacitor across the load when the difference in voltage between adjacent capacitors is 1000 volts. Diodes $51_{2-10}$ are connected across each SCR $36_{2-10}$ respectively to suppress ringing. With such an arrangement a 10 KV, 45 millisecond pulse is represented in FIG. 3 may be supplied to the load 41.

It has been found that to achieve a substantial improvement in the squareness of a pulse by use of the invention, the voltage at which the SCR switches $36_{2-10}$ are switched should be at least 25% larger than the differential voltage between the capacitors $32_{1-10}$. However, some improvement is noted in as little as 6% difference while there is a vast improvement when the switching voltage is double or more the differential voltage.

It may be found desirable to adjust the level of the load pulse 39. A network 52, therefore, may be provided which is similar to the network 28, but is provided with a string of fixed resistors $54_{1-9}$ in series with an adjustable resistor 56 across the source 42 instead of the zener diodes $44_{1-9}$. By adjustment of the resistor 56, the differential voltage across the capacitors is adjusted as well as the total voltage across the capacitors. The switching voltage may also be made adjustable by providing adjustable resistors $58_{2-10}$ for the switching current to the SCR switches $36_{2-10}$.

While examples of preferred embodiments of the invention have been shown and described, further examples of the invention will be apparent to those skilled in the art without departing from the spirit of the invention.

What is claimed is:

1. A pulse forming network for generating a high-energy square-wave pulse for delivery to a load, including:

a series of sections, each section comprising an inductor and a capacitor, one of said sections being connectable directly to the load and the other ones of said sections being serially arranged with one another and serially connected to said one section and the load, each of said other sections having respective inductors connectable to the inductor and capacitor in the next adjacent section serially connected closer to the load;

means connected to the capacitor of each of said sections for simultaneously charging each of said capacitors to a respective differential voltage level, each of said respective voltage levels being lower than the voltage level in the next adjacent section that is serially connected further from the load; and switching means for sequentially switching the stored charge in each of said sections to the load to thereby deliver a high-energy square-wave pulse to the load, said switching means including a plurality of switches, adjacent ones of said other sections having one of said switches connected between the inductor of each of said other sections to the capacitor and inductor of the next adjacent section that is serially connected closer to the load, each of said switches being normally open during charging of said capacitors to said differential voltage levels, each of said switches being responsive to a predetermined potential difference between voltages across capacitors in adjacent sections to close and thereby sequentially provide a current path from each capacitor to the load.

2. A pulse forming network according to claim 1, wherein the inductors of said sections are of equal inductance, and the capacitors of said sections are of equal capacitance.

3. A pulse forming network according to claim 1, wherein said predetermined potential difference to which said switches are responsive to close is greater than the difference between the voltages to which capacitors in adjacent sections are charged.

4. A pulse forming network according to claim 1, wherein said predetermined potential difference to which said switches are responsive to close is at least 25% greater than the difference between the voltages to which capacitors in adjacent sections are charged.

5. A pulse forming network according to claim 1, wherein said predetermined potential difference is at least double the difference between the voltages to which capacitors in adjacent sections are charges.

6. A pulse forming network according to claim 1, wherein each of said switches includes a silicon controlled rectifier and a zener diode in series with a resistor between the gate and anode of said rectifier for setting said predetermined potential difference.

7. A pulse forming network according to claim 1, wherein each of said switches includes means operable for adjusting said predetermined potential difference.

8. A pulse forming network according to claim 1, wherein said charging means includes a string of zener diodes serially connected to apply differential voltages to said capacitors.

9. A pulse forming network according to claim 1, wherein said charging means includes means for adjusting the differential voltages applied to said capacitors.

* * * * *